(12) United States Patent
Han

(10) Patent No.: US 11,444,223 B2
(45) Date of Patent: Sep. 13, 2022

(54) LIGHT EMITTING DEVICE

(71) Applicant: Seoul Semiconductor Co., Ltd., Ansan-si (KR)

(72) Inventor: Bo Yong Han, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 59 days.

(21) Appl. No.: 16/565,832

(22) Filed: Sep. 10, 2019

(65) Prior Publication Data
US 2020/0083409 A1 Mar. 12, 2020

Related U.S. Application Data

(60) Provisional application No. 62/730,098, filed on Sep. 12, 2018.

(51) Int. Cl.
*H01L 33/50* (2010.01)
*H01L 25/075* (2006.01)
*H05B 45/10* (2020.01)

(52) U.S. Cl.
CPC ........ *H01L 33/504* (2013.01); *H01L 25/0753* (2013.01); *H05B 45/10* (2020.01)

(58) Field of Classification Search
CPC .... H01L 33/504; H01L 25/0753; H05B 45/10
See application file for complete search history.

(56) References Cited

U.S. PATENT DOCUMENTS

| 8,449,129 | B2 | 5/2013 | Harbers et al. |
| 9,004,705 | B2* | 4/2015 | Li .......................... H01L 33/54 |
| | | | 362/84 |
| 9,559,272 | B2 | 1/2017 | Ouderkirk |
| 9,560,714 | B1* | 1/2017 | Hjerde ................... H05B 45/28 |

(Continued)

FOREIGN PATENT DOCUMENTS

| KR | 10-2011-0109460 | 10/2011 |
| KR | 10-2013-0079803 | 7/2013 |

(Continued)

OTHER PUBLICATIONS

Extended European Search Report dated Feb. 17, 2022, in European Patent Application No. 19858951.7 (with English Translation).

*Primary Examiner* — Phat X Cao
(74) *Attorney, Agent, or Firm* — H.C. Park & Associates, PLC

(57) ABSTRACT

A light emitting device including at least one first light emitting unit including an ultraviolet or violet light emitting diode chip and a first wavelength converter, at least one second light emitting unit including an ultraviolet or violet light emitting diode chip and a second wavelength converter, and at least one third light emitting unit including an ultraviolet or violet light emitting diode chip and a third wavelength converter, in which color coordinates of the first light emitting unit, the second light emitting unit, and the third light emitting unit define a triangular region in a CIE-1931 coordinate system, the triangular region including at least a portion of the Plankian locus, and a maximum color temperature of the Plankian locus included in the triangular region is 5000K or higher, and a minimum color temperature of the Plankian locus included in the triangular region is 3000K or lower.

20 Claims, 17 Drawing Sheets

(56) References Cited

U.S. PATENT DOCUMENTS

| | | |
|---|---|---|
| 10,231,305 B2 | 3/2019 | Yamakawa et al. |
| 2006/0126326 A1 | 6/2006 | Ng et al. |
| 2012/0300452 A1* | 11/2012 | Harbers .................... F21V 7/30 |
| | | 362/231 |
| 2017/0238390 A1 | 8/2017 | Yamakawa et al. |
| 2018/0139817 A1* | 5/2018 | Yamakawa ............. H01L 33/54 |
| 2019/0373700 A1* | 12/2019 | Meir ...................... H05B 45/20 |

FOREIGN PATENT DOCUMENTS

| | | |
|---|---|---|
| KR | 10-2014-0057291 | 5/2014 |
| KR | 10-2018-0011191 | 1/2018 |
| WO | 2014-042706 | 3/2014 |

* cited by examiner

LIGHT EMITTING DEVICE

CROSS-REFERENCE TO RELATED APPLICATION

This application claims the benefit of U.S. Provisional Application No. 62/730,098, filed Sep. 12, 2018, which is hereby incorporated by reference for all purposes as if fully se forth herein.

BACKGROUND

Field

Exemplary embodiments of the invention relate generally to a light emitting device and, more specifically, to a light emitting device capable of changing a spectral power distribution thereof to correspond to a spectral power distribution of sunlight.

Discussion of the Background

Most living organisms have been adapted to work in accordance with changes in sunlight. A human body has also been adapted to sunlight for a long period time. As such, the circadian rhythm of a human being changes in accordance with the change of sunlight. Especially in the morning, cortisol hormone is secreted in the human body under bright sunlight. Cortisol hormone allows more blood to be supplied to each organ of the body to counteract external stimuli, such as stress. Accordingly, pulses and respiration are increased and the human body is awakened from sleep to prepare for outside activities. In the daytime, physical activities are performed under strong sunlight, but melatonin hormone is secreted in the evening and lowers pulse rate, body temperature, and blood pressure, which gets a human body tired and helps human to fall asleep.

However, in modern society, most people do not perform physical activities under sunlight, and mainly work in indoors, such as homes and offices. It is normal that most people stay indoors longer than the hours of physical activity under sunlight, even in the midday.

In the meantime, indoor lighting devices generally exhibit a constant spectral power distribution, and spectral power distributions of indoor lighting devices are different from the spectral power distribution of sunlight. For example, when a light emitting device using blue, green, and red light emitting diodes, even though white light can be realized by a combination of blue, green, and red, the light emitting device does not exhibit a spectral power distribution over a wide wavelength range of visible range as in sunlight, but exhibit a distribution having a peak at a certain wavelength.

FIG. 1 is a graph illustrating spectral power distributions of black body radiation corresponding to several color temperatures located on a Plankian locus on a CIE color coordinate system, and FIG. 2 is a graph illustrating spectral power distributions of white light sources based on a conventional blue light emitting diode chip corresponding to several correlated color temperatures.

Referring to FIGS. 1 and 2, a spectrum of black body radiation, such as the sun, has a higher intensity in a blue wavelength region as a color temperature is higher, similar to that of a conventional white light source. However, as the color temperature increases, a spectrum of the white light source shows a distinct difference from that of the blackbody radiation. For example, at a temperature of 6500 K, the spectrum of blackbody radiation tends to slowly decrease in intensity of light from the blue region to a red region. However, as shown in FIG. 2, in a white lighting apparatus based on the blue light emitting diode chip, light of the blue wavelength region becomes relatively stronger than other visible regions as the color temperature increases.

Human lenses that have adapted to the solar spectrum may be damaged by light in the unusually strong blue wavelength region, which may result in poor vision. In addition, when retinal cells are exposed to excessive energy in the blue region, abnormal signals may be transmitted to the brain, which may negatively affect the body's circadian rhythm by abnormally producing or inhibiting hormones, such as cortisol and melatonin.

The above information disclosed in this Background section is only for understanding of the background of the inventive concepts, and, therefore, it may contain information that does not constitute prior art.

SUMMARY

Light emitting devices constructed according to exemplary embodiments of the invention and lighting apparatuses including the same are capable of preventing the human lens or retina from being damaged by light in an abnormal blue region or may alleviate the damage therefrom.

Exemplary embodiments also provide a light emitting device and a lighting apparatus capable of changing a spectral power distribution thereof to correspond to a spectral power distribution change of sunlight.

Additional features of the inventive concepts will be set forth in the description which follows, and in part will be apparent from the description, or may be learned by practice of the inventive concepts.

A light emitting device according to an exemplary embodiment includes at least one first light emitting unit including an ultraviolet or violet light emitting diode chip and a first wavelength converter, at least one second light emitting unit including an ultraviolet or violet light emitting diode chip and a second wavelength converter, and at least one third light emitting unit including an ultraviolet or violet light emitting diode chip and a third wavelength converter, in which color coordinates of the first light emitting unit, the second light emitting unit, and the third light emitting unit define a triangular region in a CIE-1931 coordinate system, the triangular region including at least a portion of the Plankian locus, and a maximum color temperature of the Plankian locus included in the triangular region is 5000K or higher, and a minimum color temperature of the Plankian locus included in the triangular region is 3000K or lower.

The maximum color temperature may be 6000K or higher, and the minimum color temperature may be 2700K or lower.

The maximum color temperature may be 6500K or higher.

The maximum color temperature may be 10000K or higher, and the minimum color temperature may be 1800K or lower.

A color coordinate of the second light emitting unit may be located above the Plankian locus on the CIE-1931 coordinate system, a color coordinate of the first light emitting unit may be closer to a color temperature 5000K than those of the second and third light emitting units, and a color coordinate of the third light emitting unit may be closer to a color temperature 3000K than those of the first and second light emitting units.

The first, second, and third light emitting units may be configured to be operated by dimming to continuously realize color temperatures on the Plankian locus included in the triangular region.

Each of the at least one first light emitting unit, the at least one second light emitting unit, and the at least one third light emitting unit may be provided in plural.

The light emitting device may further include a base, in which the first light emitting units, the second light emitting units, and the third light emitting units may be regularly disposed on the base.

The first light emitting units, the second light emitting units, and the third light emitting units may be disposed in one row or in a matrix.

The first light emitting unit, the second light emitting unit, and the third light emitting unit may define a single group, and may be disposed to form a triangular shape.

The first, second, and third light emitting units of an adjacent group may have an inverted triangular shape.

A distance between adjacent first light emitting units, a distance between adjacent second light emitting units, and a distance between adjacent third light emitting units may be the same.

The light emitting device may further include at least one fourth light emitting unit including an ultraviolet or violet light emitting diode chip and a fourth wavelength converter, in which a color coordinate of the fourth light emitting unit may be disposed near the color coordinate of the third light emitting unit.

The color coordinate of the third light emitting unit may be located above the Plankian locus on the CIE-1931 coordinate system, and the color coordinate of the fourth light emitting unit may be located below the Plankian locus on the CIE-1931 coordinate system.

A lighting apparatus including a light emitting device according to another exemplary embodiment includes at least one first light emitting unit including an ultraviolet or violet light emitting diode chip and a first wavelength converter, at least one second light emitting unit including an ultraviolet or violet light emitting diode chip and a second wavelength converter, and at least one third light emitting unit including an ultraviolet or violet light emitting diode chip and a third wavelength converter, in which color coordinates of the first light emitting unit, the second light emitting unit, and the third light emitting unit define a triangular region in a CIE-1931 coordinate system, the triangular region including at least a portion of the Plankian locus, and a maximum color temperature of the Plankian locus included in the triangular region is 5000K or higher, and a minimum color temperature of the Plankian locus included in the triangular region is 3000K or lower.

The maximum color temperature may be 6500K or higher, and the minimum color temperature may be 2700K or lower.

The lighting apparatus may further include a base, in which the first, second, and third light emitting units may be regularly disposed on the base.

The first to third light emitting units may be configured to be operated by dimming.

The lighting apparatus may further include at least one fourth light emitting unit including an ultraviolet or violet light emitting diode chip and a fourth wavelength converter, in which a color coordinate of the fourth light emitting unit is located near the color coordinate of the third light emitting unit.

The color coordinate of the third light emitting unit may be located above the Plankian locus on the CIE-1931 coordinate system, and the color coordinate of the fourth light emitting unit may be located below the Plankian locus on the CIE-1931 coordinate system.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
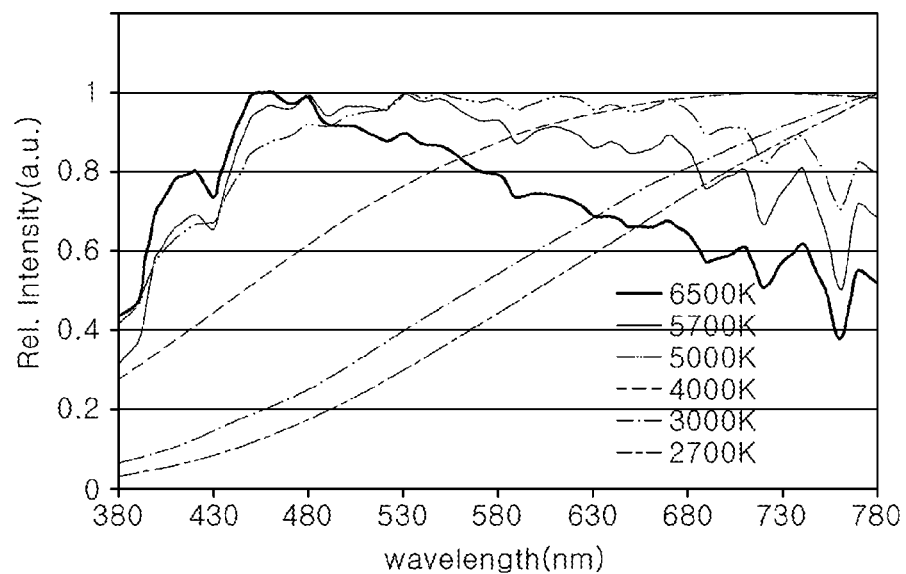
FIG. 1 is a graph illustrating spectral power distributions of black body radiation corresponding to several color temperatures located on a Plankian locus on a CIE color coordinate system.
Figure 2:
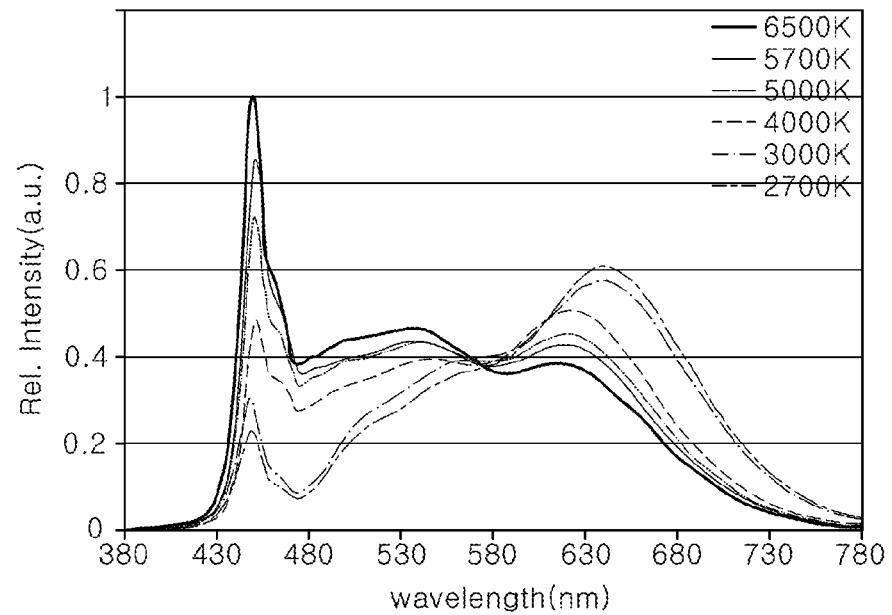
FIG. 2 is a graph illustrating spectral power distributions of white light sources based on a conventional blue light emitting diode chip corresponding to several correlated color temperatures.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings.

As used herein, the Plankian locus and specific color coordinates refer to the Plankian locus and color coordinates in the CIE-1931 coordinate system defined by the American National Standards Institute (ANSI), unless otherwise specified. The CIE-1931 coordinate system can be easily changed to the 1976 coordinate system by simple mathematical conversion.

Figure 3:
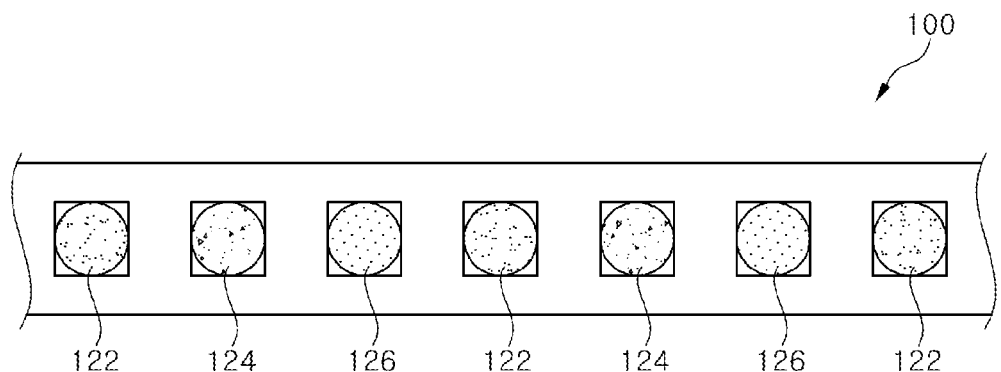
FIG. 3 is a schematic plan view of a light emitting device according to an exemplary embodiment.
Figure 4:
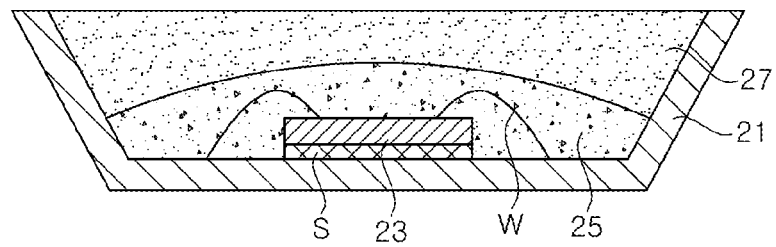
FIG. 4 is a schematic cross-sectional view of a light emitting unit according to an exemplary embodiment.

FIG. 3 is a schematic plan view of a light emitting device according to an exemplary embodiment, and FIG. 4 is a schematic cross-sectional view illustrating a light emitting unit according to an exemplary embodiment.

Referring to FIG. 3, a light emitting device 100 includes a base 110, a first light emitting unit 122, a second light emitting unit 124, and a third light emitting unit 126.

The base 110 may include a circuitry, such as a printed circuit board for supplying power to each of the light emitting units 122, 124, and 126. In addition, an integrated circuit device or the like may be mounted on the base 110.

The first to third light emitting units 122, 124, and 126 may be disposed on the base 110. A plurality of first light emitting units 122, a plurality of second light emitting units 124, and a plurality of third light emitting units 126 may be disposed on the base 110. In addition, as illustrated in FIG. 3, the first to third light emitting units 122, 124, and 126 may be disposed in a group, which may be repeatedly formed in one column.

In the illustrated exemplary embodiment, three different light emitting units 122, 124, and 126 are disposed on the base 110, but the inventive concepts are not limited thereto. For example, in some exemplary embodiments, two or four or more types of light emitting units may be disposed.

The first to third light emitting units 122, 124, and 126 may have a similar structure, but the first to third light emitting units 122, 124, and 126 generally emit light corresponding to a certain color temperature on the Plankian locus, respectively. A structure of a light emitting unit will be described in more detail with reference to FIG. 4.

Referring to FIG. 4, each of the light emitting units 122, 124, and 126 may include a light emitting diode chip 23 and a wavelength converter 25, and may include a housing 21 and a molding 27.

The housing 21 may have leads for electrical connection and may have a cavity.

The light emitting diode chip 23 may be mounted in the cavity of the housing 21, and electrically connected to the leads. The light emitting diode chip 23 may generally be a lateral light emitting diode chip, and thus, may be electrically connected to the leads by bonding wires.

The light emitting diode chip 23 emits light having a shorter wavelength than that of the blue light emitting diode chip. For example, the light emitting diode chip 23 may be a purple chip or an ultraviolet chip. In particular, the light emitting diode chip 23 may emit light having a peak wavelength in a range of 300 nm to 440 nm, specifically in a range of 380 nm to 440 nm, and more specifically in a range of 400 nm to 420 nm.

The first to third light emitting units 122, 124, and 126 may include the same type of light emitting diode chip 23, which emits light having the same peak wavelength, but the inventive concepts are not limited thereto. In some exemplary embodiments, the first to third light emitting units 122, 124, and 126 may include light emitting diode chips emitting light having different peak wavelengths within the ranges described above. However, all of the first to third light emitting units 122, 124, and 126 emit light having a shorter wavelength than that of the blue light emitting diode chip, and thus, light emitted by using the first to third light emitting units 122, 124, and 126 may have weak intensity in the blue region, as compared with a conventional light emitting light source.

The wavelength converter 25 may be disposed in the cavity of the housing 21 to cover the light emitting diode chip 23. The wavelength converter 25 converts light emitted from the light emitting diode chip 23 into light having a longer wavelength.

The wavelength converter 25 may include one or more kinds of phosphors. A light emitting unit may emit light of a desired color temperature by using the light emitting diode chip 23 and the wavelength converter 25.

The wavelength converter 25 may include, for example, a blue phosphor, a green phosphor, a yellow phosphor, or a red phosphor. For example, blue phosphors may include BAM-based, halo-phosphate-based, or aluminate-based phosphors, and may include, for example, $BaMgAl_{10}O_{17}:Mn^{2+}$, $BaMgAl_{12}O_{19}:Mn^{2+}$, or $(Sr,Ca,Ba)PO_4Cl:Eu^{2+}$. The blue phosphor may have, for example, a peak wavelength in a range of 440 nm to 500 nm.

Green or yellow phosphors may include $LuAG(Lu_3(Al,Gd)_5O_{12}:Ce^{3+})$, $YAG(Y_3(Al,Gd)_5O_{12}:Ce^{3+})$, $Ga-LuAG((Lu,Ga)_3(Al,Gd)_5O_{12}:Ce^{3+})$, $Ga-YAG$ $((Ga,Y)_3(Al,Gd)_5O_{12}:Ce^{3+})$, $LuYAG$ $((Lu,Y)_3(Al,Gd)_5O_{12}:Ce^{3+})$, ortho-silicate $((Sr,Ba,Ca,Mg)_2SiO_4:Eu^{2+})$, oxynitride $((Ba,Sr,Ca)Si_2O_2N_2:Eu^{2+})$, or thio gallate $(SrGa_2S_4:Eu^{2+})$. The green or yellow phosphor may have a peak wavelength in a range of 500 nm to 600 nm.

Red phosphors may include nitride, sulfide, fluoride, or oxynitride, and more specifically, CASN $(CaAlSiN_3:Eu^{2+})$, $(Ba,Sr,Ca)_2Si_5N_8:Eu^{2+}$, $(Ca,Sr)S_2:Eu^{2+}$, or $(Sr,Ca)_2SiS_4:Eu^{2+}$. The red phosphor may have a peak wavelength in a range of 600 nm to 700 nm.

The molding 27 is formed in the cavity of the housing 21 to cover the wavelength converter 25. The molding 27 is formed of a material transparent to light. In particular, the molding 27 may be formed of methyl-based silicone or phenyl-based silicone, and moreover, may be formed of phenyl-based silicone. Phenyl silicone is prone to yellowing from ultraviolet rays, but has higher strength than methyl silicones. In particular, in the illustrated exemplary embodiment, since light emitted from the light emitting diode chip 23 is converted into a long wavelength light by the wavelength converter 25, it is possible to use phenyl-based silicone without the occurrence of yellowing.

In the illustrated exemplary embodiment, the molding 27 is illustrated as being formed to cover the wavelength converter 25, but in some exemplary embodiments, the molding 27 and the wavelength converter 25 may be integrally formed. More particularly, the wavelength converter 25 may include the molding with the phosphor, and in this case, the molding covering the wavelength converter may be omitted.

In the illustrated exemplary embodiment, the light emitting diode chip 23 is a lateral type, and may be electrically connected to the leads using bonding wires. However, the inventive concepts are not limited thereto, and in some exemplary embodiments, the light emitting diode chip 23 may be a vertical type or a flip chip type light emitting diode chip. In addition, the vertical or flip chip type light emitting diode chip may be mounted in the cavity of the housing 21. In some exemplary embodiments, the flip chip type light emitting diode chip may be mounted directly on the base 110 without the housing 21.

Figure 5:
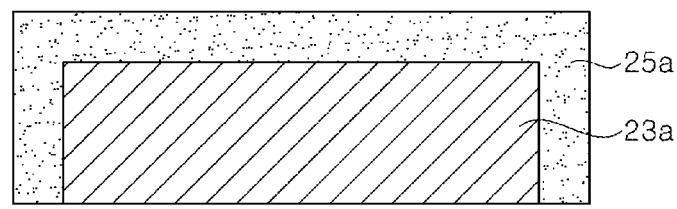
FIG. 5 is a schematic cross-sectional view of a light emitting unit according to another exemplary embodiment.

FIG. 5 illustrates a light emitting unit including a flip chip type light emitting diode chip 23a according to another exemplary embodiment. In this case, a wavelength converter 25a may cover an upper and side surfaces of the light emitting diode chip 23a. Bonding pads may be formed on a lower surface of the light emitting diode chip 23a, and, accordingly, the light emitting diode chip 23a having the wavelength converter 25a formed thereon may be mounted on the base 110 directly using the bonding pads.

Referring back to FIG. 3, the first to third light emitting units 122, 124, and 126 emit light corresponding to the color temperature on the Plankian locus, respectively, which will be described in more detail with reference to FIG. 6.

Figure 6:
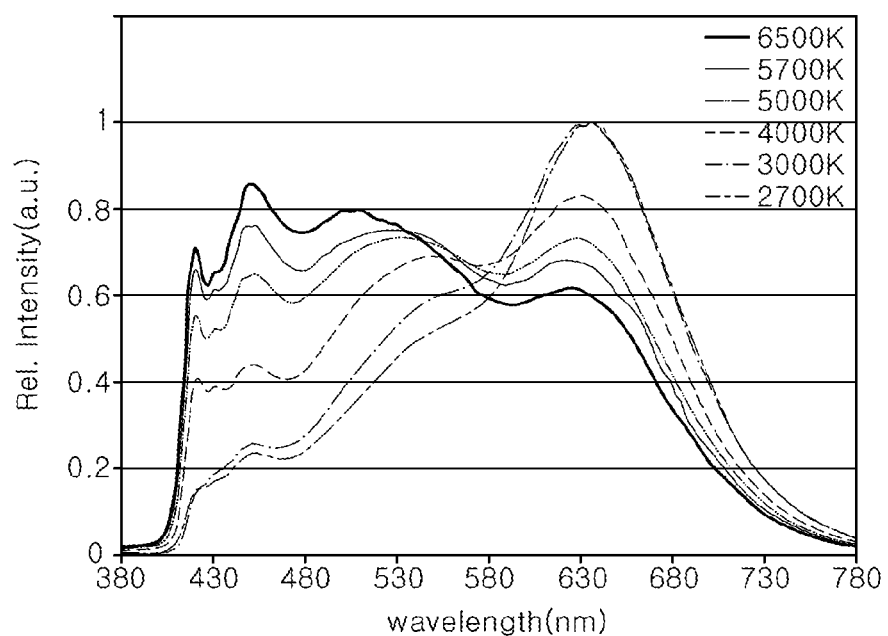
FIG. 6 is a graph illustrating spectral power distributions of various light emitting units according to an exemplary embodiment.

FIG. 6 is a graph illustrating spectral power distributions of various light emitting units according to an exemplary embodiment.

Referring to FIG. 6, spectral power distributions of light emitting units at correlated color temperatures from 2700K to 6500K are shown. Each light emitting unit includes a light emitting diode chip and a wavelength converter having shorter wavelength than the blue light emitting diode chip, and has an average color rendering index of 95 or more. The light emitting diode chip may have a peak wavelength of, for example, about 416 nm, and phosphors are suitably selected to realize the correlated color temperature of each light emitting unit and the average color rendering index of 95 or more.

As shown in FIG. 6, as the color temperature increases from 2700K to 6500K, an intensity of a blue wavelength region increases. However, since light in the blue wavelength region is emitted from the blue phosphor, it does not exhibit abnormally high intensity at a certain wavelength. In addition, the intensity of light emitted from the phosphor is higher than that of light emitted from the light emitting diode chip.

Accordingly, the light emitting units according to the exemplary embodiments may lower the intensity of the blue region in comparison with a light emitting unit using the conventional blue light emitting diode chip.

A spectral difference between the white light source based on the conventional blue light emitting diode chip and the light source using the light emitting units according to the exemplary embodiments may be confirmed through fidelity index (Rf) calculated by IES TM-30-15. Table 1 shows average color rendering indices (CRI) and fidelity indices according to correlated color temperatures of light sources based on the blue light emitting diode chip, and Table 2 shows average color rendering indices and fidelity indices according to correlated color temperatures of the light emitting units.

TABLE 1

CRI and fidelity index Rf of light source based on the blue light emitting diode chip and light source based on the purple light emitting diode chip.

| CCT | | 6500K | 5700K | 5000K | 4000K | 3000K | 2700K |
|---|---|---|---|---|---|---|---|
| Blue- | CRI | 96.8 | 96.2 | 96.1 | 95.6 | 95.3 | 96.8 |
| base | Rf | 91.3 | 90.6 | 90.0 | 89.1 | 93.3 | 94.5 |
| Violet- | CRI | 98.6 | 98.1 | 98.1 | 97.7 | 97.8 | 97.2 |
| base | Rf | 97.7 | 98.1 | 98.3 | 97.7 | 97.3 | 96.7 |

Referring to Table 1, the conventional light source based on the blue light emitting diode chip shows a relatively low value of the fidelity index Rf, even if the CRI of 95 or more is met. In particular, the difference between the CRI and the fidelity index Rf is not large in a region where the correlated color temperature is low, but the difference between the CRI and the fidelity index Rf is large in a region where the correlated color temperature is high.

However, it can be confirmed that the difference between the CRI and the fidelity index Rf of the light emitting units according to the exemplary embodiments based on the violet light emitting diode chip is not large. Accordingly, the light source based on the purple light emitting diode chip may emit light having spectrum similar to the actual spectrum of sunlight.

Meanwhile, the light emitting units according to the exemplary embodiments are disposed in a single light emitting device, and thus, it is possible to realize various color temperatures with the single light emitting device.

Figure 7:
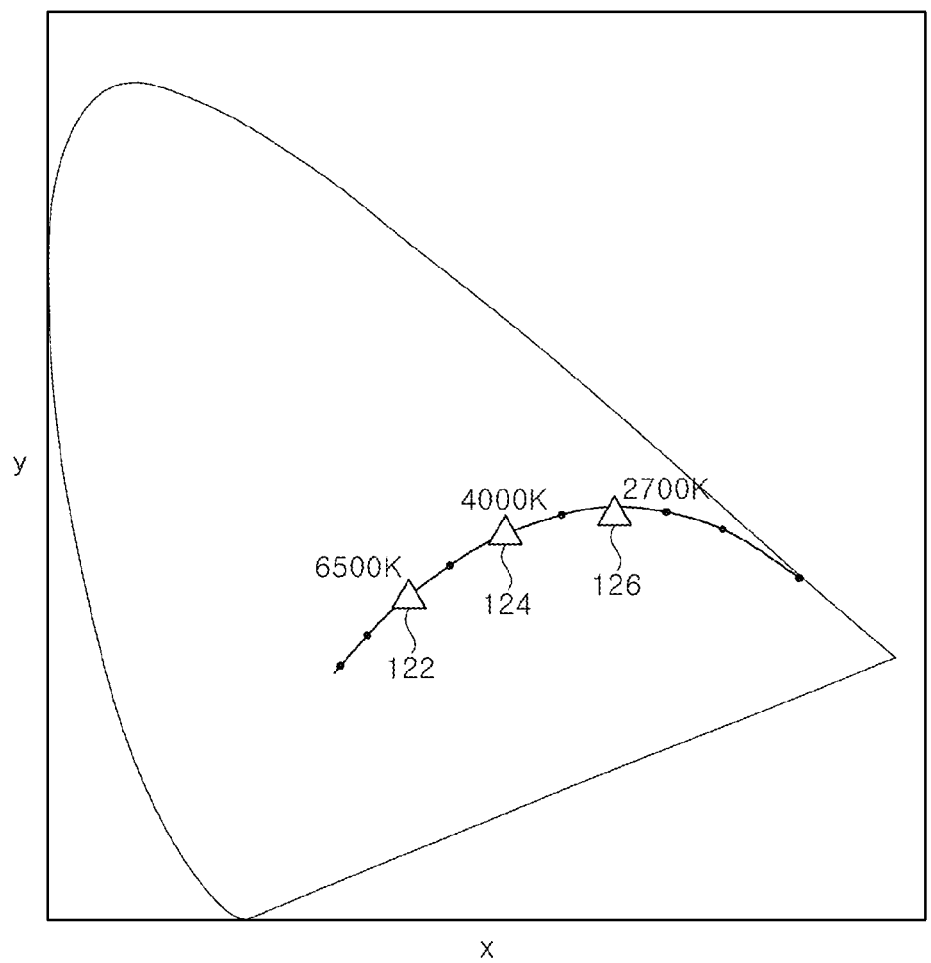
FIG. 7 shows schematic color coordinates for illustrating a light emitting device according to an exemplary embodiment.

FIG. 7 shows schematic color coordinates for illustrating a light emitting device according to an exemplary embodiment. Hereinafter, the light emitting device will be described with reference to that shown in FIG. 3, which includes a first to third light emitting units 122, 124, and 126.

The first to third light emitting units 122, 124, and 126 may have color temperatures of 6500K, 4000K, and 2700K, respectively. The light emitting units 122, 124, and 126 may be disposed on a base 110, as shown in FIG. 3.

Light emitting units 126 of 2700K may be driven to realize light corresponding to morning or evening sunlight, and light emitting units 122 of 6500K may be driven to realize light corresponding to daytime sunlight. In addition, the light emitting units 124 of 4000K may be driven to realize light corresponding to sunlight in the middle of morning and midday, or in the middle of midday and evening. In this manner, the first to third light emitting units 122, 124, and 126 may be selectively operated in accordance with the desired color temperature, and thus, the color temperature of the light source may be changed in accordance with the spectral change of sunlight throughout the day.

In the illustrated exemplary embodiment, the first to third light emitting units 122, 124, and 126 have the color temperatures of 6500K, 4000K, and 2700K, respectively. However, the inventive concepts are not limited thereto, and the first to third light emitting units 122, 124, and 126 may have other color temperatures. The light emitting units 122, 124, 126 are located on or near the Plankian locus line, as shown in FIG. 7.

As described above, at least one light emitting unit among the first to third light emitting units 122, 124, and 126 may operate to realize light having a certain color temperature. For example, the second and third light emitting units 124 and 126 may be turned off while the first light emitting unit 122 is operating, the first and third light emitting units 122 and 126 may be turned off while the second light emitting unit 124 is operating, and the first and second light emitting units 122 and 124 may be turned off while the third light emitting unit 126 is operating. However, the inventive concepts are not limited thereto. For example, the first light emitting unit 122 and the second light emitting unit 124 may be driven by dimming, so as to realize correlated color temperatures between 6500K and 4000K, and the second light emitting unit 124 and the third light emitting unit 126 may be driven by dimming, so as to realize correlated color temperatures between 4000K and 2700K. As such, the first to third light emitting units 122, 124, and 126 in combination may realize light corresponding to substantially entire correlated color temperatures between 6500K and 2700K.

Figure 8:
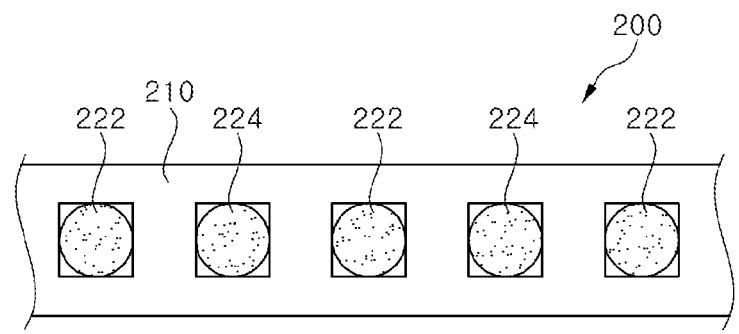
FIG. 8 is a schematic plan view of a light emitting device according to another exemplary embodiment.
Figure 9:
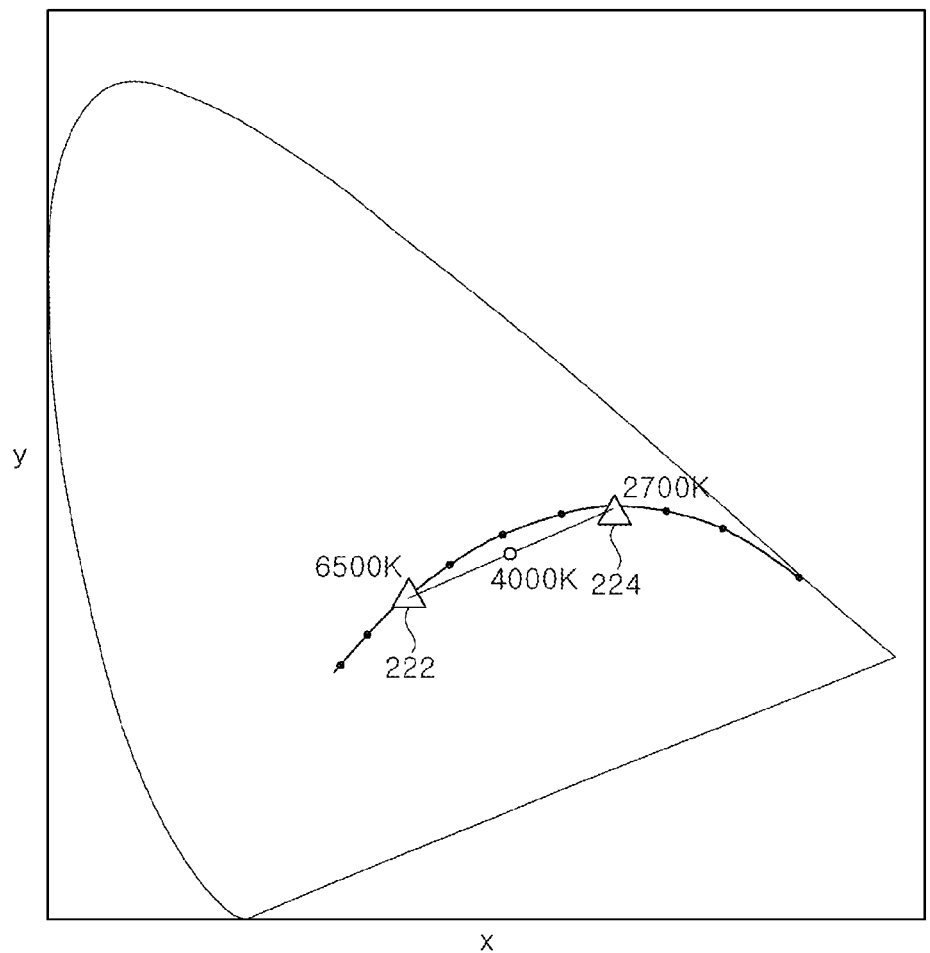
FIG. 9 shows schematic color coordinates for illustrating the light emitting device of FIG. 8.

FIG. 8 is a schematic plan view of a light emitting device 200 according to another exemplary embodiment, and FIG. 9 shows schematic color coordinates for illustrating the light emitting device of FIG. 8.

Referring to FIG. 8, the light emitting device 200 according to the illustrated exemplary embodiment is similar to the light emitting device 100 of FIG. 3, except that two types of light emitting units 222 and 224 having different color temperatures are used. More particularly, the first light emitting units 222 and the second light emitting units 224 are disposed on a base 210. The first light emitting units 222 and the second light emitting units 224 may be alternately disposed.

Since the base 210 is the same as the base 110 described above, detailed descriptions thereof will be omitted. In addition, since the structures of the first light emitting units 222 and the second light emitting units 224 are similar to those described with reference to FIGS. 4 and 5, detailed descriptions thereof will be omitted.

Referring to FIG. 9, the first light emitting unit 222 may have a color temperature of, for example, 6500K, and the second light emitting unit 224 may have a color temperature of, for example, 2700K. The light emitting units 222 and 224 having color temperatures of 6500K and 2700K may be used to realize light corresponding to the spectrum of daytime sunlight and light corresponding to the spectrum of morning or evening sunlight.

Further, the first light emitting unit 222 of 6500K and the second light emitting unit 224 of 2700K may be driven by dimming, and thus, light having different correlated color temperatures between 6500K and 2700K may be realized. For example, to realize light having a color temperature of 4000K, the first light emitting units 222 of 6500K and the second light emitting units 224 of 2700K may be driven together.

According to the illustrated exemplary embodiment, types of the light emitting units may be reduced, thereby further simplifying the operation of the light emitting device.

Figure 10:
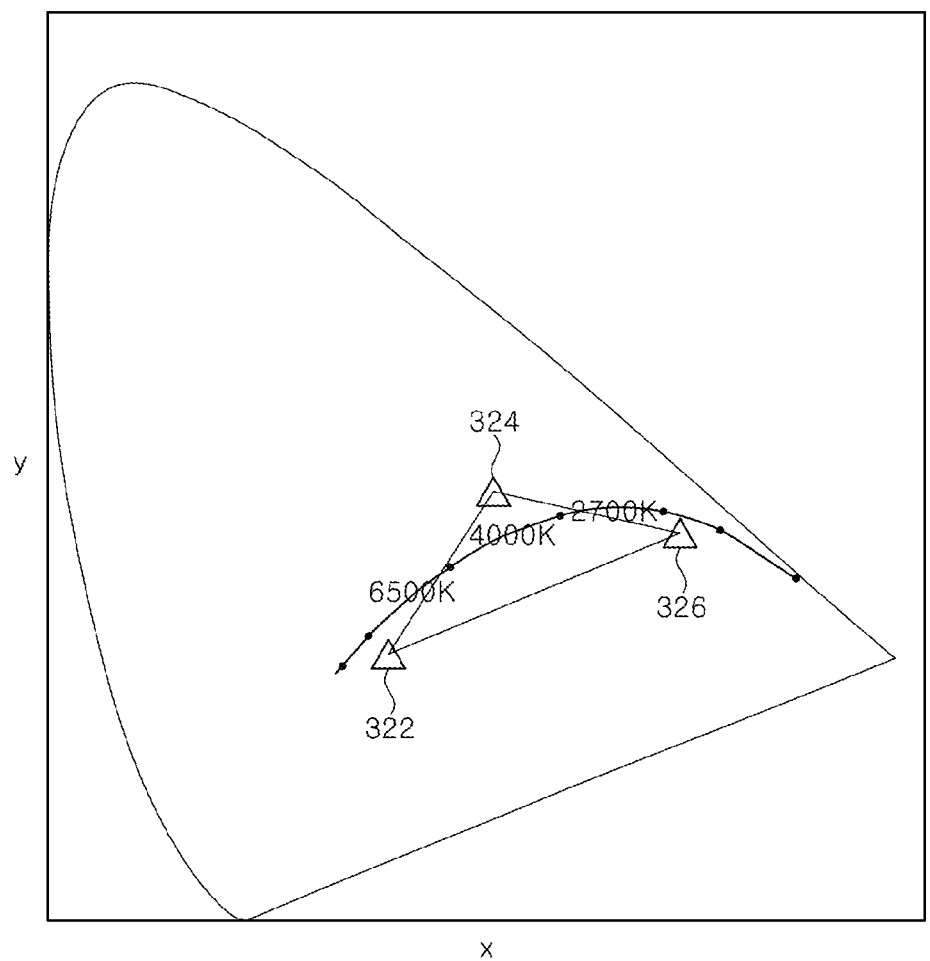
FIG. 10 shows schematic color coordinates for illustrating a light emitting device according to another exemplary embodiment.

FIG. 10 shows schematic color coordinates for illustrating a light emitting device according to another exemplary embodiment. The light emitting device according to the illustrated exemplary embodiment includes three types of light emitting units, that is, a first to third light emitting units 322, 324, and 326, which may be disposed on a base 110 described with reference to FIG. 3.

In addition, as described above, each of the light emitting units 322, 324, and 326 includes an ultraviolet chip or a purple chip, and includes a wavelength converter to wavelength-convert light emitted from the light emitting diode chip. However, the color coordinates of the light emitting units 322, 324, and 326 of the illustrated exemplary embodiment are different from those described with reference to FIG. 7, and the color coordinates are set by using the light emitting diode chip and the wavelength converter.

In the illustrated exemplary embodiment, the first light emitting unit 322, the second light emitting unit 324, and the third light emitting unit 326 are disposed to realize color temperatures 3000K to 5000K on the Plankian locus. However, unlike the light emitting device described with reference to FIG. 7, the first to third light emitting units 322, 324, and 326 may not have the color coordinates on the Plankian locus.

The first light emitting unit 322 may have a color coordinate closer to the color temperature of 5000K than the second and third light emitting units 324 and 326, and the third light emitting unit 326 may have a color coordinate closer to the color temperature 3000K than the first and second light emitting units 322 and 324. For example, the first light emitting unit 322 may have a color temperature of 5000K, and the third light emitting unit 326 may have a color temperature of 3000K.

Meanwhile, the second light emitting unit 324 has a color coordinate located above the Plankian locus curve on the CIE-1931 color coordinate system. In particular, an x-coordinate value of the second light emitting unit 324 may be an x-coordinate value in a range between the color temperature 5000K and the color temperature 3000K on the Plankian locus.

Further, none of a straight line connecting the color coordinate of the first light emitting unit 322 and that of the second light emitting unit 324; a straight line connecting the color coordinate of the second light emitting unit 324 and that of the third light emitting unit 326, and a straight line connecting the color coordinate of the first light emitting unit 322 and that of the third light emitting unit 326 crosses the region between 5000K and 3000K on the Plankian locus. More particularly, a triangular region defined by the color coordinates of the first to third light emitting units 322, 324, and 326, and a curved portion between the color temperature 5000K and the color temperature 3000K on the Plankian locus is disposed in the triangular region. For example, the straight line connecting the color coordinate of the first light emitting unit 322 and that of the second light emitting unit 324 may pass the color temperature of 5000K, and the straight line connecting the color coordinate of the second light emitting unit 324 and that of the third light emitting unit 326 may pass the color temperature 3000K. In addition, the straight line connecting the color coordinate of the first light emitting unit 322 and that of the third light emitting unit 326 may pass the color temperature of 5000K or the color temperature of 3000K.

According to the illustrated embodiment, the first to third light emitting units 322, 324, and 326 may be driven by dimming, and thus, each color temperature on the Plankian locus in a range between the color temperature 3000K and 5000K may be realized. Further, since none of the first to third light emitting units 322, 324, and 326 includes the blue light emitting diode chip, it is possible to prevent light having abnormally high intensity from being emitted in the blue region.

According to the illustrated exemplary embodiment, a maximum color temperature CTmax realized may be 5000K or higher depending on the first light emitting unit 322 and the second light emitting unit 324, and a minimum color temperature CTmin may be 3000K or lower depending on the second light emitting unit 324 and the third light emitting unit 326.

Color temperatures 3000K and 5000K may be minimum requirements for responding to spectral changes of light during a day, and light corresponding to the spectral changes in sunlight within this range may be similarly emitted.

To realize light more similar to sunlight, the maximum color temperature CTmax may be further increased, and the minimum color temperature CTmin may be further reduced. For example, the maximum color temperature CTmax may be 6000K or higher, 6500K or higher, and further 10000K or higher. In addition, the minimum color temperature CTmin may be 2700K or lower, and further, 1800K or lower.

The first light emitting unit 322 has an x-coordinate value equal to or smaller than an x-coordinate of the color coordinate corresponding to the maximum color temperature CTmax in a color temperature range to be implemented. The second light emitting unit 324 has a value within an x-coordinate range of the color temperature range to be implemented, and the third light emitting unit 326 has an x-coordinate value equal to or greater than an x-coordinate of the color coordinate corresponding to the minimum color temperature CTmin in the color temperature range to be implemented.

Figure 11:
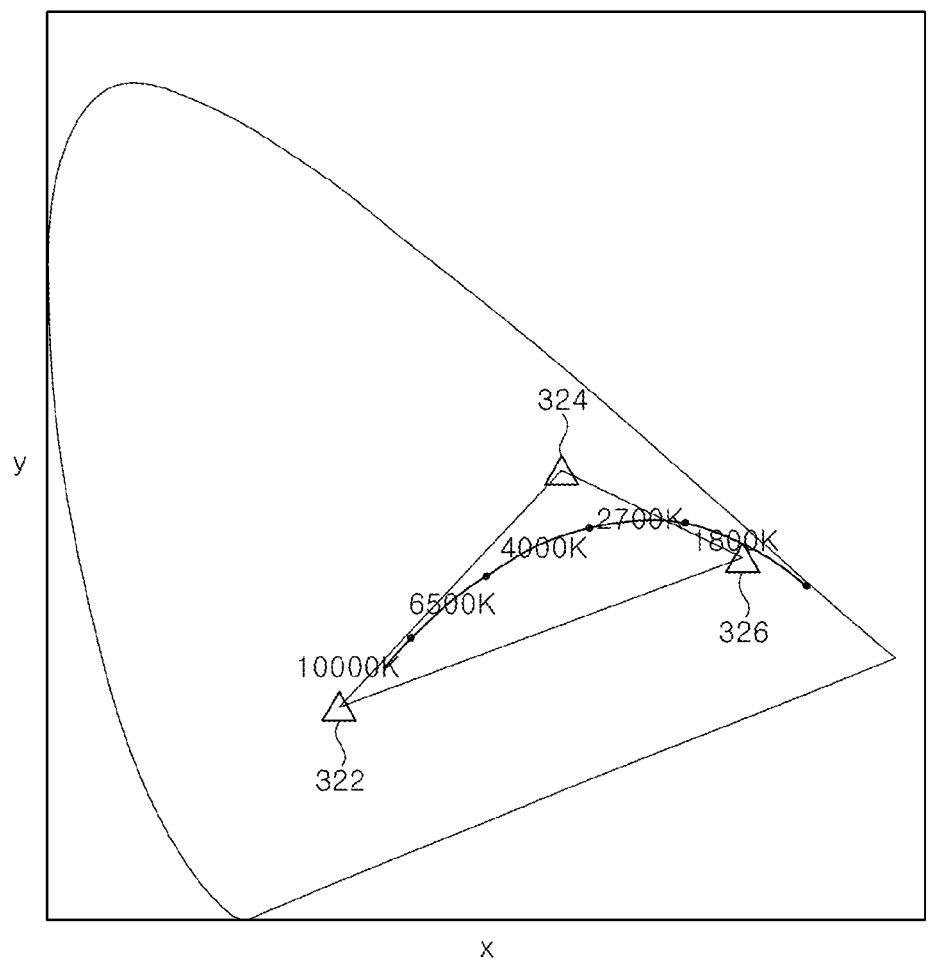
FIG. 11 shows schematic color coordinates for illustrating a light emitting device according to another exemplary embodiment.

For example, FIG. 11 shows color coordinates that may realize color temperatures on the Plankian locus in a range of 1800K to 10000K. The first light emitting unit 322 has an x-coordinate value equal to or greater than an x-coordinate of the color temperature 10000K, the second light emitting unit 324 has an x-coordinate value between 1800K and 10000K, and the third light emitting unit 326 has an x-coordinate value equal to or greater than an x-coordinate of the color temperature 1800K. Meanwhile, a y-coordinate of the second light emitting unit 324 is set, so that the color coordinate of the second light emitting unit 324 is located above the Plankian locus. In addition, y-coordinate values of the first light emitting unit 322 and the third light emitting unit 326 are set to have values between 0 and 1, so that a triangular region defined by color coordinates of the first to third light emitting units 322, 324, and 326 includes the Plankian locus between the color temperatures 1800K and 10000K.

In the light emitting devices of FIGS. 10 and 11, the color temperatures on the Plankian locus may be realized by operating the first to third light emitting units 322, 324, and 326 by dimming. Accordingly, all color temperatures within a range of the maximum color temperature CTmax to the minimum color temperature CTmin may be realized. Color temperatures other than the maximum color temperature CTmax and the minimum color temperature CTmin may be realized by operating all three types of light emitting units 322, 324, and 326. The maximum color temperature CTmax may be realized by the first light emitting unit 322, a combination of the first light emitting unit 322 and the second light emitting unit 324, and a combination of the first light emitting unit 322 and the third light emitting unit 326, or by a combination of the first to third light emitting units 322, 324, and 326. The minimum color temperature CTmin may be realized by the third light emitting unit 326, a combination of the second light emitting unit 324 and the third light emitting unit 326, a combination of the first light emitting unit 322 and the third light emitting unit 326, or by a combination of the first to third light emitting units 322, 324, and 326. As such, most of the color temperatures may be realized by operating each kind of light emitting units 322, 324, and 326 by dimming. In the light emitting device described with reference to FIG. 7, some light emitting units may be in a standby state to realize a certain color temperature, while the operation thereof may be stopped. However, according to the illustrated exemplary embodiment, each of the light emitting unit may be driven together, thereby reducing the number of light emitting units required for the lighting apparatus.

Figure 12:
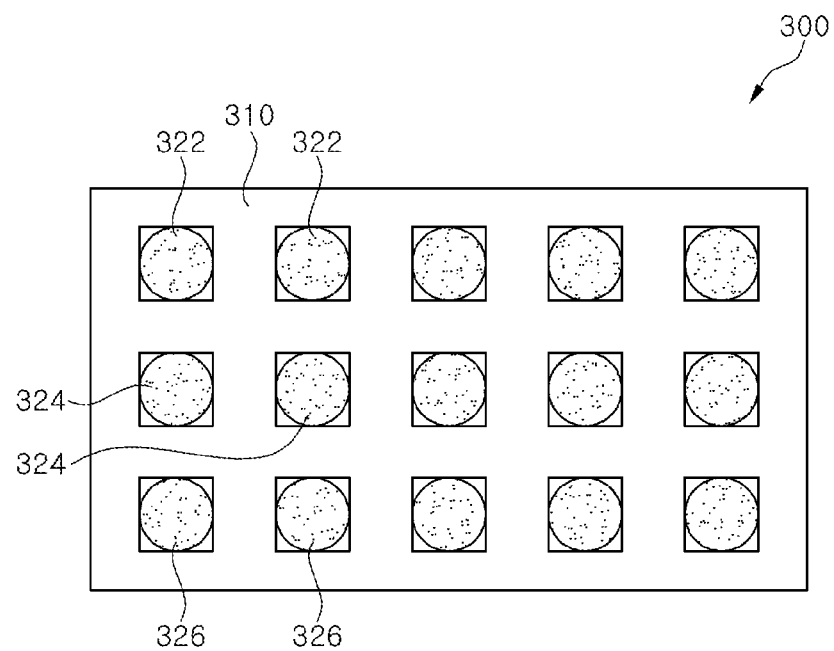
FIG. 12 is a schematic plan view of a light emitting device according to another exemplary embodiment.
Figure 13:
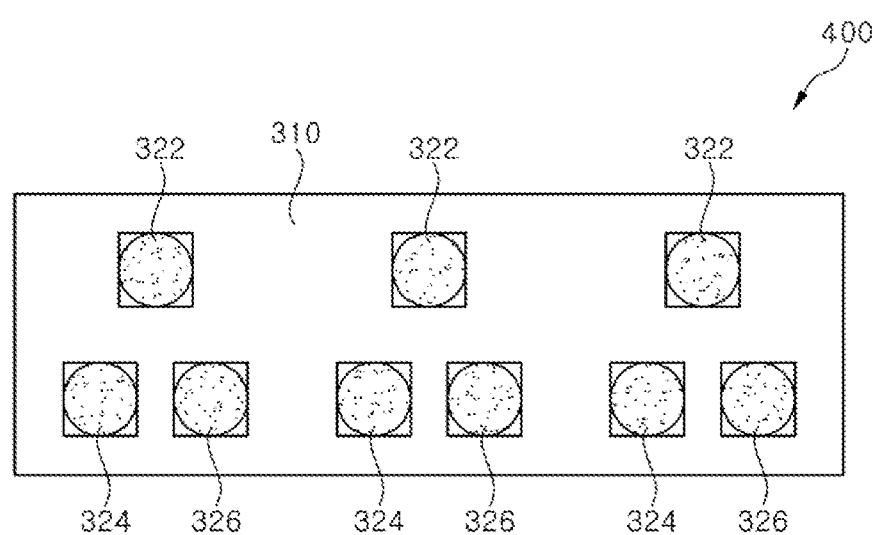
FIG. 13 is a schematic plan view of a light emitting device according to another exemplary embodiment.
Figure 14:
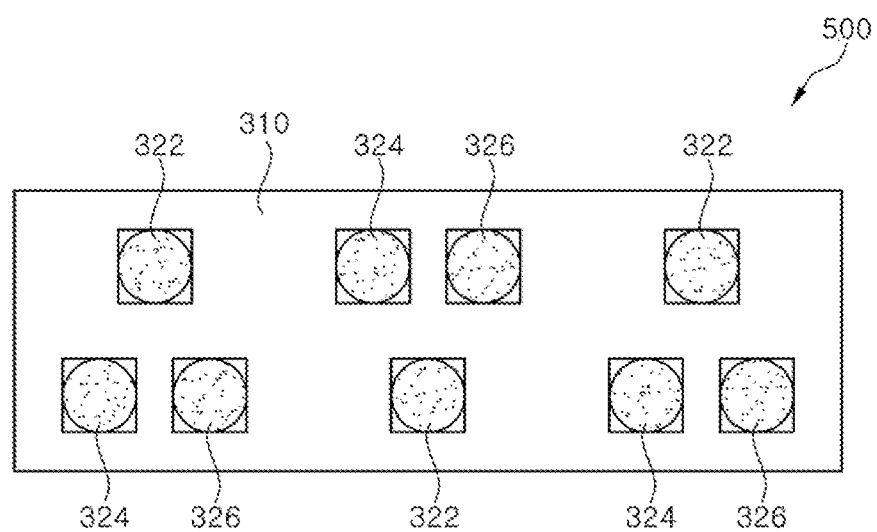
FIG. 14 is a schematic plan view of a light emitting device according to another exemplary embodiment.

Meanwhile, as illustrated with reference to FIG. 3, the first to third light emitting units 322, 324, and 326 may be disposed as a group on the base, which may be repeatedly formed along one column, but the inventive concepts are not limited thereto. FIGS. 12 to 14 illustrate light emitting devices 300, 400, and 500, in which the first to third light emitting units 322, 324, and 326 are disposed on the base 310 in various ways. Hereinafter, since the base 310 is similar to the base 110 described with reference to FIG. 3, detailed descriptions thereof will be omitted.

Referring to FIG. 12, the first to third light emitting units 322, 324, and 326 may be disposed in a matrix. For example, the first light emitting units 322 may be disposed in a first row, the second light emitting units 324 may be disposed in a second row, and the third light emitting units 326 may be disposed in a third row. Moreover, the first to third light emitting units 322, 324, and 326 may be disposed together in the same column.

Referring to FIG. 13, the first light emitting unit 322, the second light emitting unit 324, and the third light emitting unit 326 may be disposed in a triangle as one group, and these groups may be repeatedly disposed in the same manner. In this manner, the light emitting device 400 according to the illustrated exemplary embodiment may emit emitting more uniform light than the light emitting device 300 of FIG. 12.

Referring to FIG. 14, the first light emitting unit 322, the second light emitting unit 324, and the third light emitting unit 326 are disposed in a triangle in one group, and these groups are repeatedly disposed with alternating orientation. That is, a group adjacent to one group disposed in the triangle has an inverted triangle shape. In particular, a distance between the same light emitting units may be constant. For example, a distance between adjacent first light emitting units, a distance between adjacent second light emitting units and a distance between adjacent third light emitting units may be equal to each other. Accordingly, the light emitting device 500 according to the illustrated exemplary embodiment may emit more uniform light than the light emitting device 400.

Figure 15:
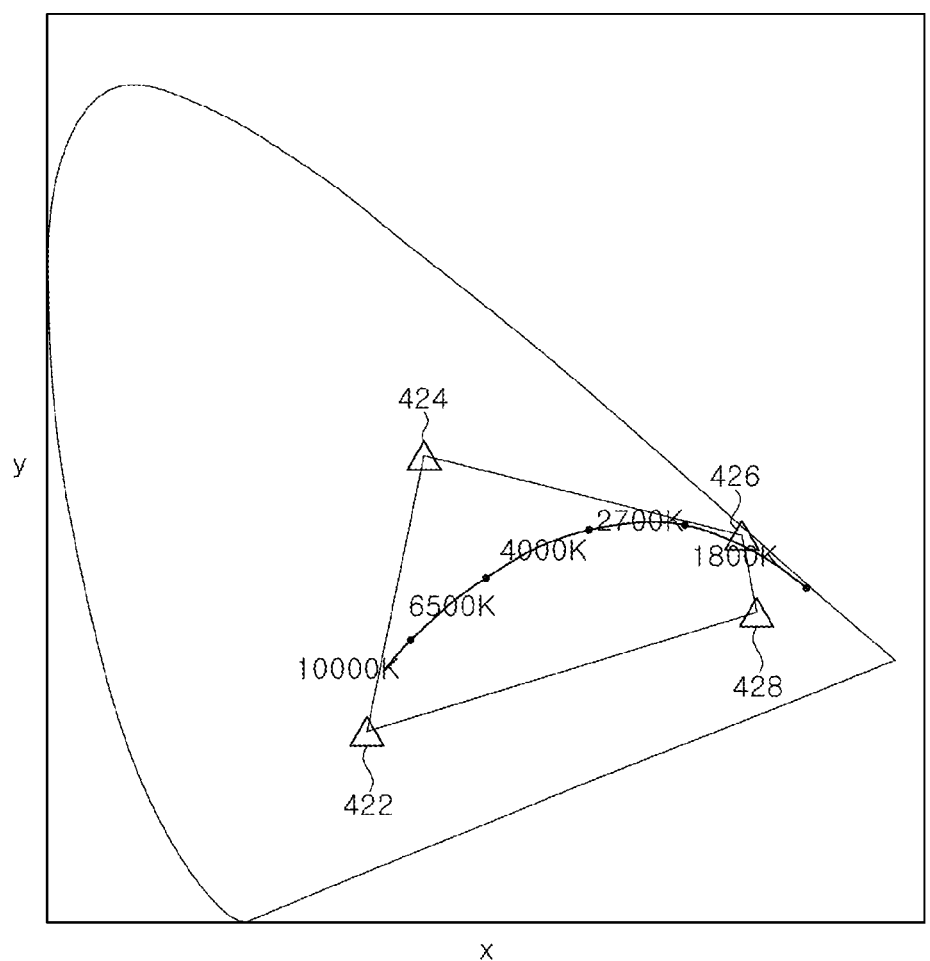
FIG. 15 shows schematic color coordinates for illustrating a light emitting device according to another exemplary embodiment.

FIG. 15 shows schematic color coordinates for illustrating a light emitting device according to another exemplary embodiment.

Referring to FIG. 15, the light emitting device according to the illustrated exemplary embodiment includes first to fourth light emitting units 422, 424, 426, and 428. Each of the first to fourth light emitting units 422, 424, 426, and 428 includes an ultraviolet or violet light emitting diode chip and a wavelength converter.

A rectangular region is defined by the color coordinates of the first to fourth light emitting units 422, 424, 426, and 428, and a Plankian locus is located in the rectangular region. Accordingly, each color temperature on the Plankian locus located in the rectangular region may be realized through a combination of the first to fourth light emitting units 422, 424, 426, and 428.

In particular, the first light emitting unit 422 may have a color coordinate near a color temperature of 10000K, and the second light emitting unit 424 may have a color coordinate located above the Plankian locus on the CIE-1931 coordinate system. The third light emitting unit 426 and the fourth light emitting unit 428 may be located near the color temperature 1800K, the third light emitting unit 426 may be located above the Plankian locus, and the fourth light emitting unit 428 may be located below the Plankian locus.

According to the illustrated exemplary embodiment, the light emitting device may realize a color temperature of 1800K to 10000K. However, the inventive concepts are not limited thereto, and the first to fourth light emitting units 422, 424, 426, and 428 may be set to realize, for example, a color temperature range of 3000K to 5000K or higher.

Figure 16:
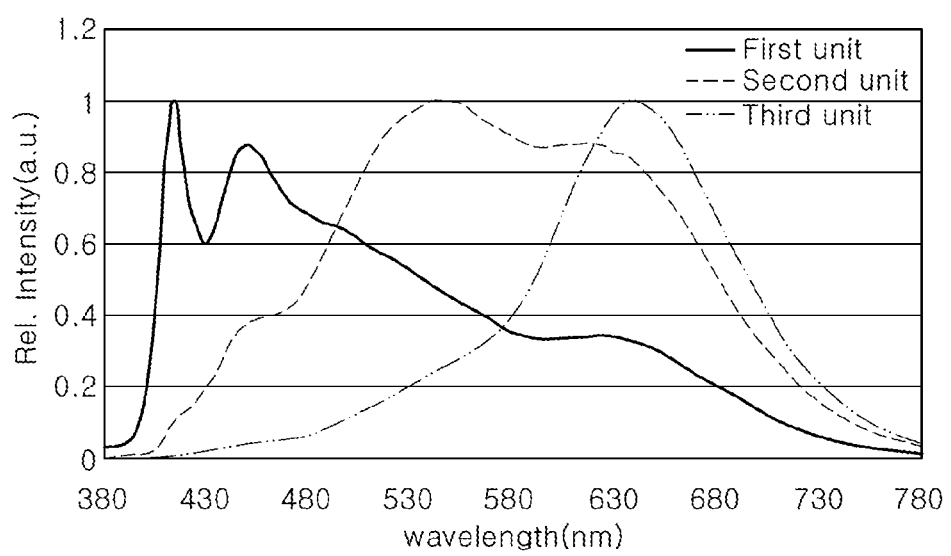
FIG. 16 is a graph illustrating spectral power distributions of light emitting diodes according to an exemplary embodiment.
Figure 17:
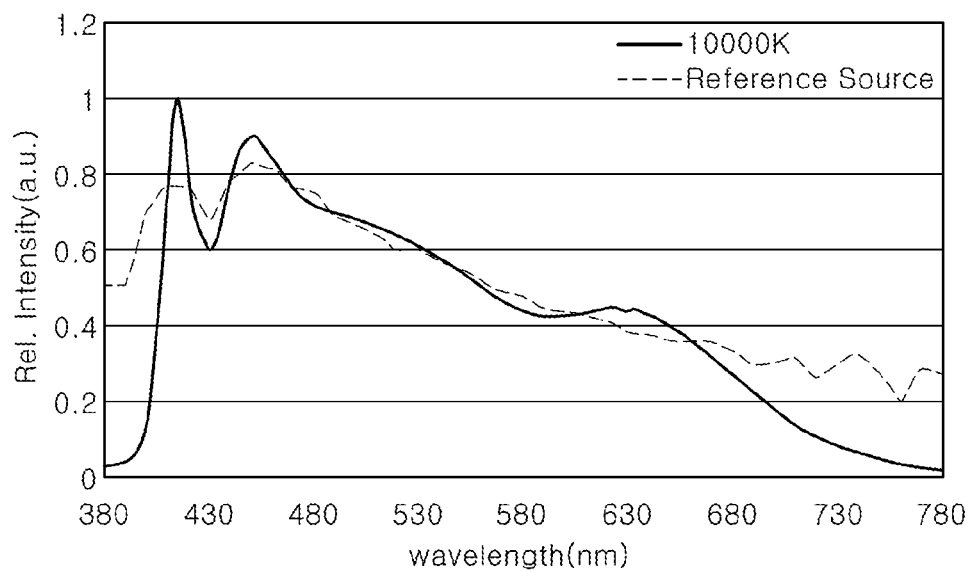
FIGS. 17, 18, 19, 20, 21, 22, 23, 24, 25, 26, 27, and 28 are graphs illustrating comparisons between various spectrums realized by using the light emitting devices of FIG. 16, and spectrums of black body radiation (reference light source) at correlated color temperatures corresponding to the spectrums of the light emitting devices.
Figure 18:
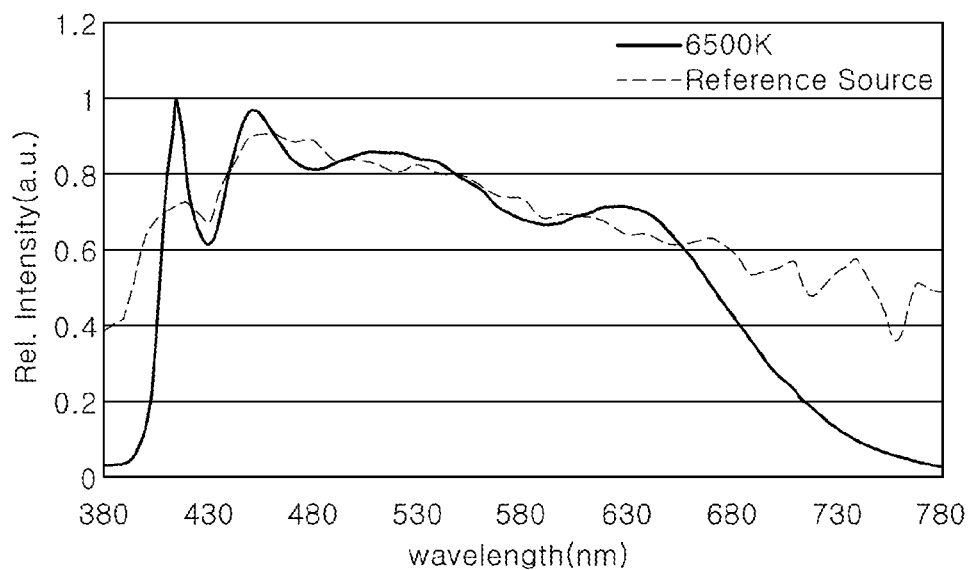
Figure 19:
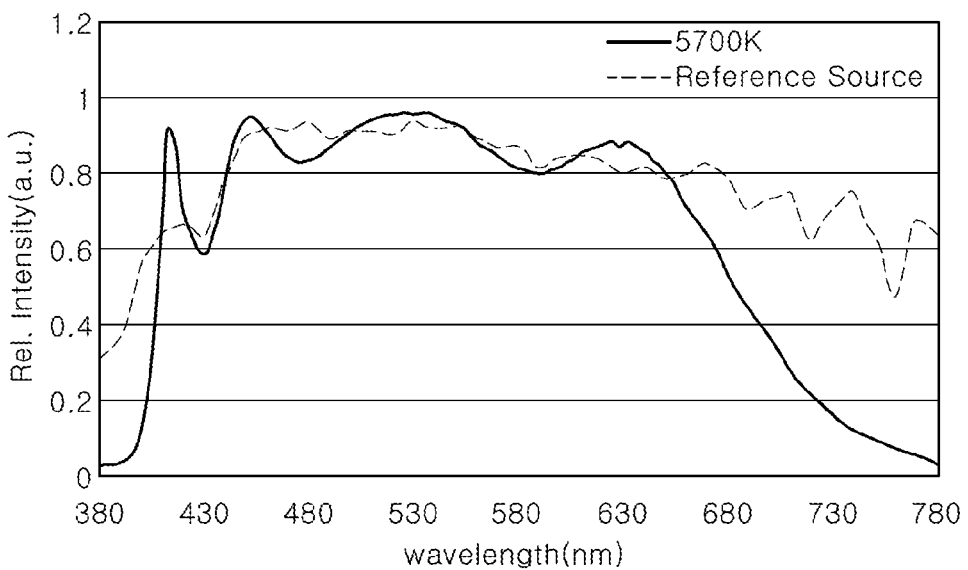
Figure 20:
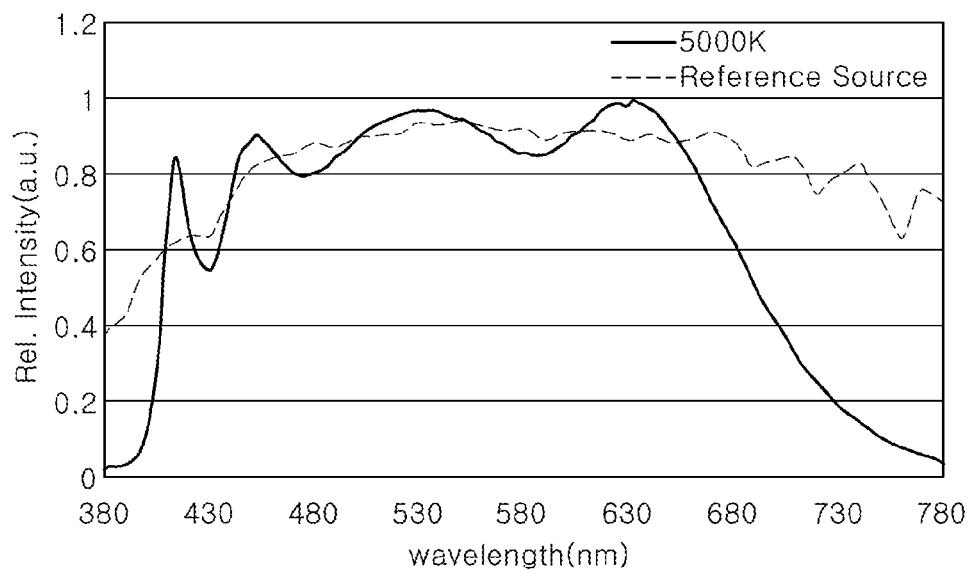
Figure 21:
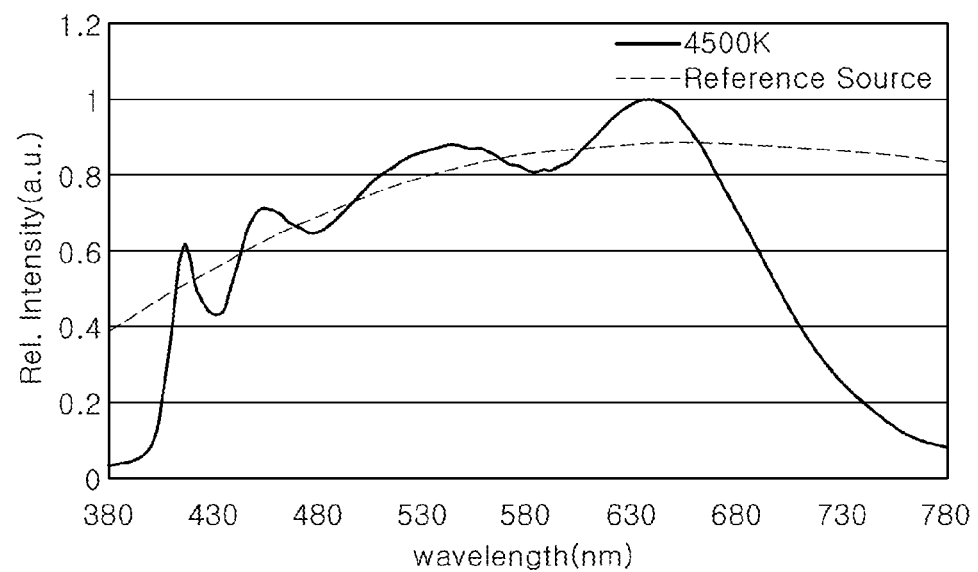
Figure 22:
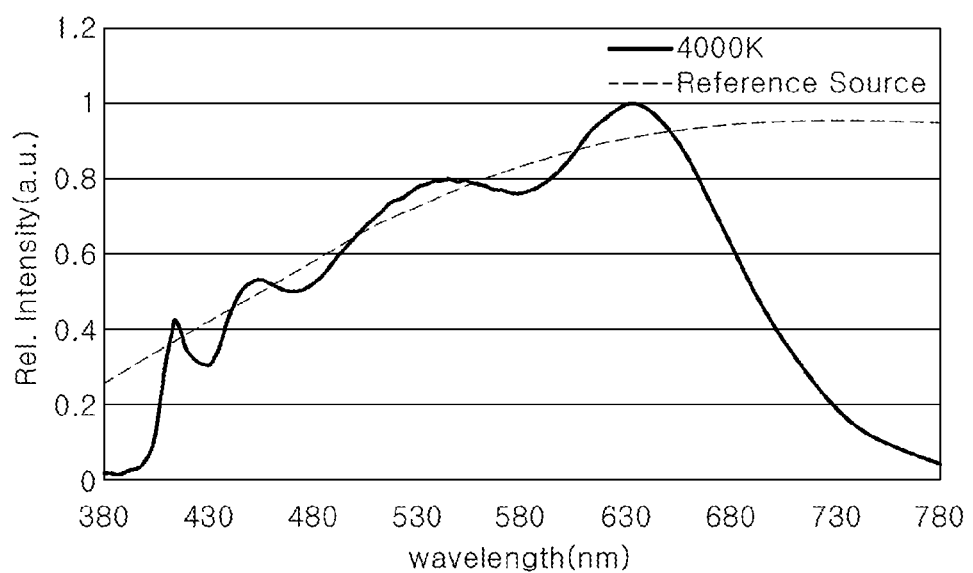
Figure 23:
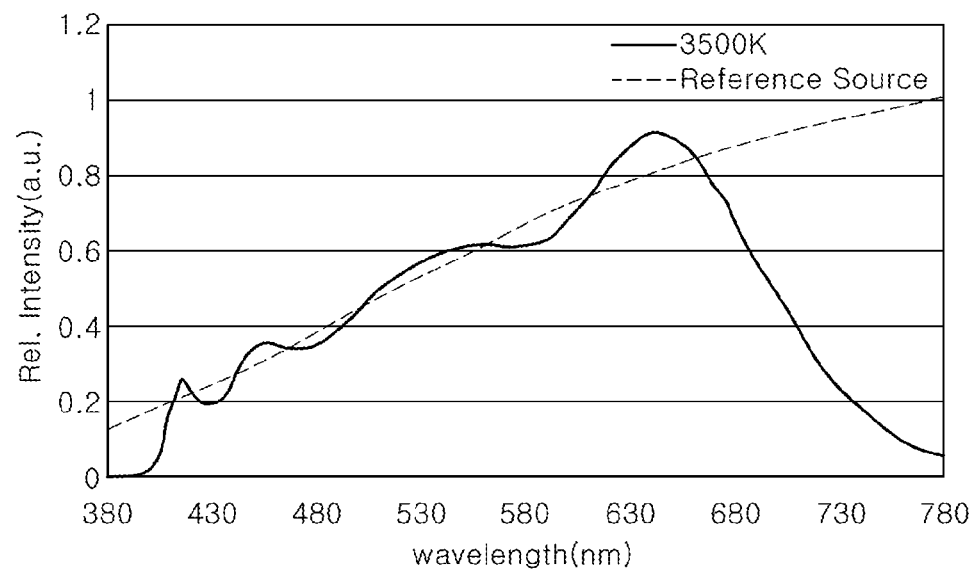
Figure 24:
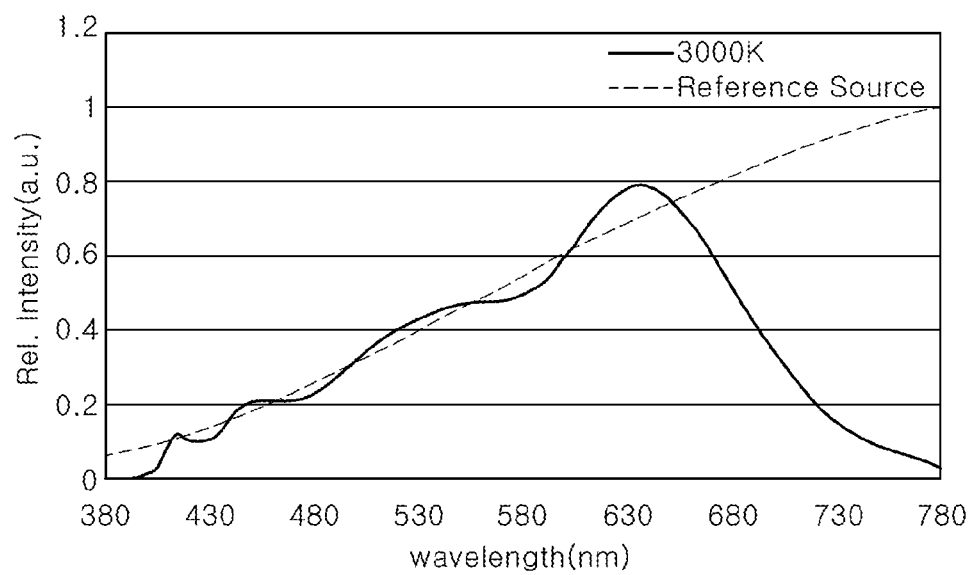
Figure 25:
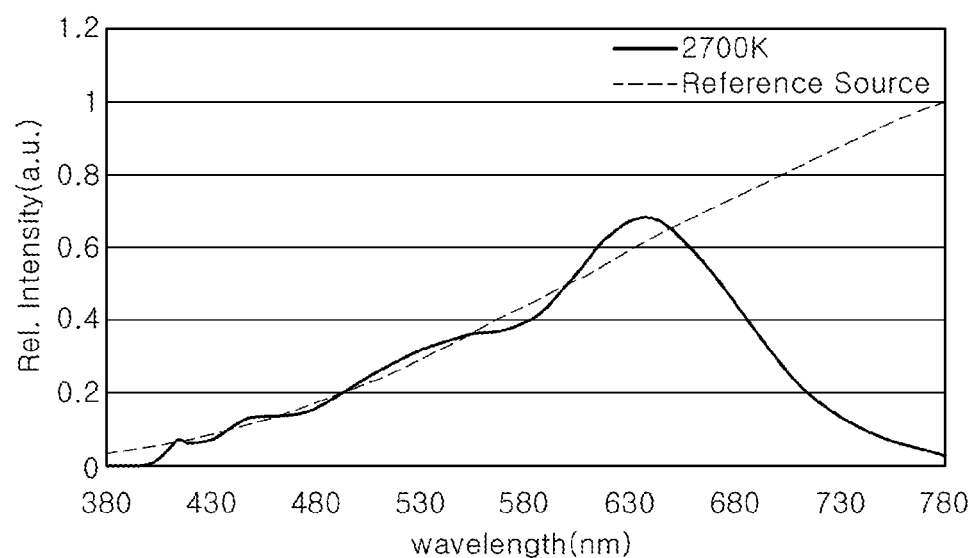
Figure 26:
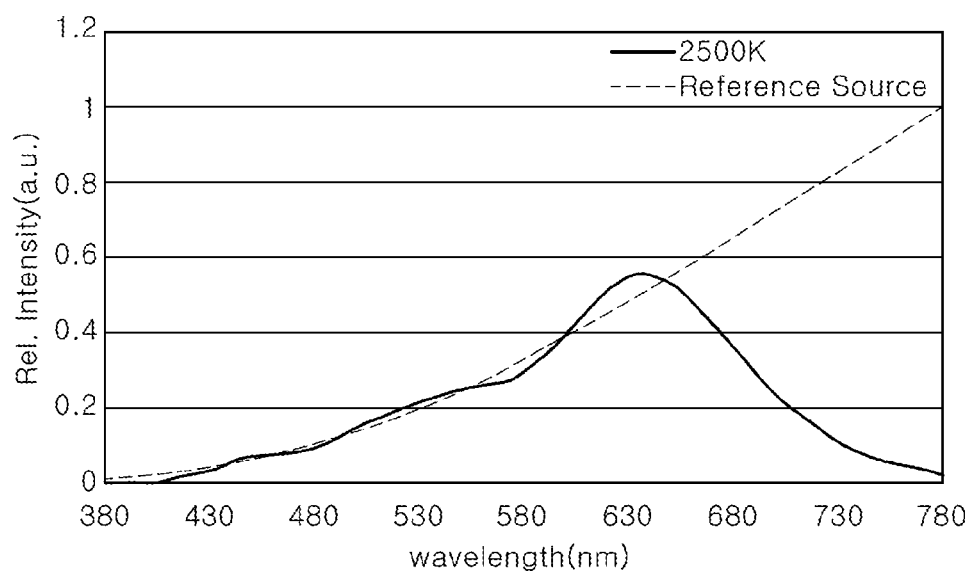
Figure 27:
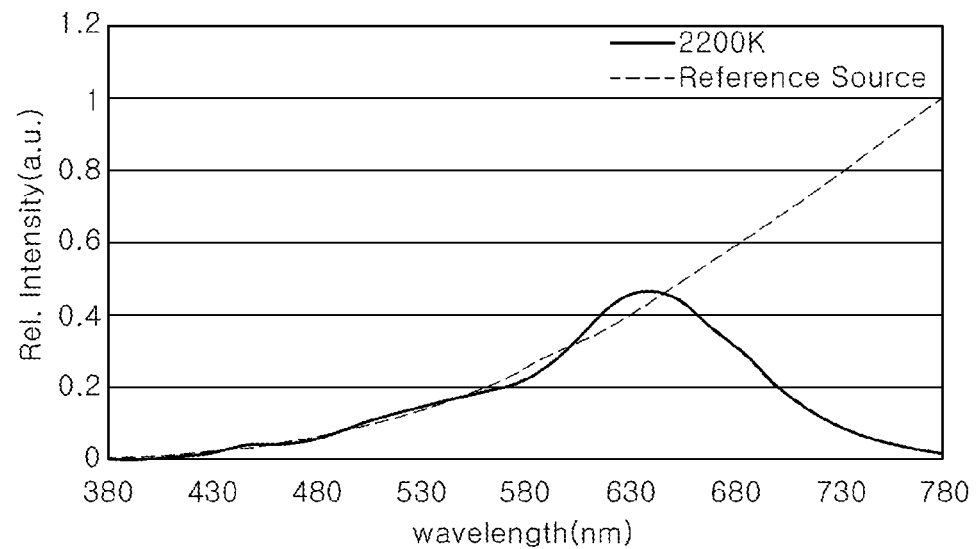
Figure 28:
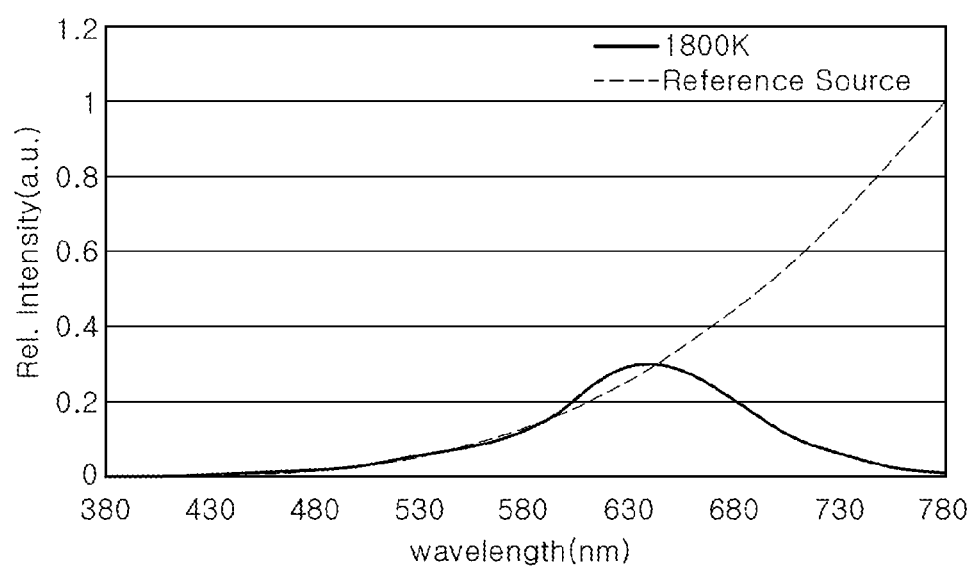

FIG. 16 is a graph illustrating spectral power distributions of first to third light emitting units according to an exemplary embodiment. FIGS. 17 through 28 are graphs illustrating comparisons between various spectrums realized by using the light emitting units of FIG. 16 and spectrums of black body radiation (reference light source) at correlated color temperatures corresponding to the spectrums thereof.

Each of the first to third light emitting units includes a violet light emitting diode chip having a peak wavelength of about 416 nm. Further, the first light emitting unit includes a blue phosphor, a green phosphor, a yellow phosphor, and a red phosphor, where a color coordinate (x, y) is (0.2638, 0.2756), a correlated color temperature is 13597K, and Duv (delta u, v) is 0.0043. The second light emitting unit includes a blue phosphor, a green and a yellow phosphor, and a red phosphor, where a color coordinate (x, y) is (0.3860, 0.4354), a correlated color temperature is 4222K, and Duv is 0.0236. The third light emitting unit includes a blue phosphor, a green and a yellow phosphor, and a red phosphor, where a color coordinate (x, y) is (0.5439, 0.4055), a correlated color temperature is 1822K, and Duv is 0.000.

The first to third light emitting units may be driven by dimming, and thus, various color temperatures ranging from the color temperature of 1800K to 10000K may be realized. FIGS. 17 through 28 show spectrums at various color temperatures realized by using the first to third light emitting units in comparison with the reference light source.

Referring to FIGS. 17 to 28, it can be confirmed that the spectrums at various color temperatures realized by the first to third light emitting units are generally matched with the spectrum, due to black body radiation in the visible region. In particular, it can be confirmed that an intensity of light in the blue region is not abnormally higher than an intensity of light in other regions, even at a high color temperature.

Table 2 shows average color rendering index CRI and fidelity index Rf at various color temperatures realized by using the first to third light emitting units.

TABLE 2

CRI and Rf of the light emitting device according to an exemplary embodiment

| CCT | CRI | Rf |
|---|---|---|
| 10000K | 96.2 | 96.9 |
| 6500K | 97.6 | 98.1 |
| 5700K | 98.3 | 98.3 |
| 5000K | 97.3 | 98.2 |
| 4500K | 97.4 | 97.5 |
| 4000K | 97.4 | 97.4 |
| 3500K | 95.6 | 96.8 |
| 3000K | 95.6 | 96.4 |
| 2700K | 95.2 | 95.9 |
| 2500K | 95.6 | 94.8 |
| 2200K | 95.0 | 94.6 |
| 1800K | 94.3 | 91.8 |

Referring to Table 2, the color temperatures are realized by combining the first to third light emitting units, and thus, not only CRI but also Rf may be maintained at a high value, thereby realizing light similar to sunlight.

In addition, when each of the first to third light emitting units are used to realize a color temperature within a predetermined range, the number of light emitting units actually used under the same power consumption may be reduced. This will be described in more detail below. In the light emitting devices according to exemplary embodiments, a driving voltage of each light emitting unit is fixed at 3V and power consumption is fixed at 27 W.

First, as similarly shown in FIG. 7, when driving three types of light emitting units 122, 124, and 126 corresponding to respective color temperatures with the power consumption of 27 W in a switching on/off manner, 90 light emitting units may be used. For example, 90 pieces of the first light emitting units 122 operate to realize a color temperature of 6500K, 90 pieces of the second light emitting units 122 operate to realize a color temperature of 4000K, and 90 pieces of the third light emitting units 126 operate to realize a color temperature of 2700K. In addition, while one type of light emitting unit (e.g. 122) is in operation, the other light emitting units (e.g. 124 and 126) may remain in a standby state.

Accordingly, a total of 270 pieces of light emitting units are required to drive at 27 W of power consumption, and only 90 pieces of light emitting units may be operated. Meanwhile, in light emitting device of FIG. 7, when the three light emitting units 122, 124, and 126 are driven by dimming, 180 pieces of light emitting units operate out of a total of 270 pieces, and 90 pieces of light emitting units remain in the standby state.

Meanwhile, similar to the light emitting device of FIG. 9, when two types of light emitting units 222 and 224 are driven at the power consumption of 27 W by dimming, each of the light emitting units may be require 90 pieces. As such, desired color temperatures may be achieved with a total of 180 pieces of the light emitting units. However, in the light emitting device of FIG. 9, for example, it is difficult to realize color temperatures on the Plankian locus between 6500K and 2700K, and light of color coordinates located below the Plankian locus is emitted.

Meanwhile, when driving a color temperature in a desired range by using all of the first to third light emitting units 322, 324, and 326 at the power consumption of 27 W by dimming, each of the light emitting units may require, for example, 60 pieces. Accordingly, light of a desired color temperature may be realized by using all 180 pieces of the light emitting units.

In addition, when the first light emitting unit 322 or the third light emitting unit 326 has the same color coordinate as a color temperature to be realized, each of the first light emitting units 322 or the second light emitting units 326 may require 90 pieces. Even in this case, only 60 pieces of the second light emitting units 324 may be used, thereby reducing the number of light emitting units required, compared to the light emitting device of FIG. 6 operated in a switching on/off driving manner.

According to exemplary embodiments, an ultraviolet or violet light emitting diode chip may be used without using a blue light emitting diode chip, and thus it is possible to prevent the human lens or retina from being damaged by blue wavelength light. Furthermore, it is possible to realize a color temperature in a range of 3000K to 5000K on the Plankian locus, thereby providing a light emitting device capable of changing a spectral power distribution thereof to correspond to a spectral power distribution of sunlight.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:
1. A light emitting device, comprising:
at least one first light emitting unit including a light emitting diode chip and a first wavelength converter;
at least one second light emitting unit including a light emitting diode chip and a second wavelength converter; and
at least one third light emitting unit including a light emitting diode chip and a third wavelength converter,
wherein, in a blue region of a spectrum of the light emitting device, the intensity of light emitted from at least one of the first, second, and third wavelength converters is configured to be greater than that of the corresponding light emitting diode chip, wherein color coordinates of the first light emitting unit, the second light emitting unit, and the third light emitting unit define a triangular region in a CIE-1931 coordinate system, the triangular region including at least a portion of the Plankian locus, wherein a maximum color temperature of the Plankian locus included in the triangular region is 5000K or higher, and a minimum color temperature of the Plankian locus included in the triangular region is 3000K or lower, wherein color temperatures of the Plankian locus between the maximum and minimum color temperatures are all included in the triangular region, wherein a color coordinate of the first light emitting unit is closer to a color temperature 5000K than those of the second and third light emitting units, and wherein a color coordinate of the third light emitting unit is closer to a color temperature 3000K than those of the first and second light emitting units.

2. The light emitting device of claim 1, wherein the maximum color temperature is 6000K or higher, and the minimum color temperature is 2700K or lower.

3. The light emitting device of claim 2, wherein the maximum color temperature is 6500K or higher.

4. The light emitting device of claim 3, wherein the maximum color temperature is 10000K or higher, and the minimum color temperature is 1800K or lower.

5. The light emitting device of claim 1, wherein a color coordinate of the second light emitting unit is located above the Plankian locus on the CIE-1931 coordinate system.

6. The light emitting device of claim 1, wherein the first, second, and third light emitting units are configured to be operated by dimming to continuously realize color temperatures on the Plankian locus included in the triangular region.

7. The light emitting device of claim 1, wherein each of the at least one first light emitting unit, the at least one second light emitting unit, and the at least one third light emitting unit is provided in plural.

8. The light emitting device of claim 7, further comprising a base,
wherein the first light emitting units, the second light emitting units, and the third light emitting units are regularly disposed on the base.

9. The light emitting device of claim 8, wherein the first light emitting units, the second light emitting units, and the third light emitting units are disposed in one row or in a matrix.

10. The light emitting device of claim 8, wherein the first light emitting unit, the second light emitting unit, and the third light emitting unit define a single group, and are disposed to form a triangular shape.

11. The light emitting device of claim 10, wherein the first, second, and third light emitting units of an adjacent group has an inverted triangular shape.

12. The light emitting device of claim 11, wherein a distance between adjacent first light emitting units, a distance between adjacent second light emitting units, and a distance between adjacent third light emitting units are the same.

13. The light emitting device of claim 1, further comprising at least one fourth light emitting unit including an ultraviolet or violet light emitting diode chip and a fourth wavelength converter,
wherein a color coordinate of the fourth light emitting unit is disposed near the color coordinate of the third light emitting unit.

14. The light emitting device of claim 13, wherein:
the color coordinate of the third light emitting unit is located above the Plankian locus on the CIE-1931 coordinate system; and
the color coordinate of the fourth light emitting unit is located below the Plankian locus on the CIE-1931 coordinate system.

15. A lighting apparatus comprising a light emitting device, comprising:
at least one first light emitting unit including a light emitting diode chip and a first wavelength converter;
at least one second light emitting unit including a light emitting diode chip and a second wavelength converter; and
at least one third light emitting unit including a light emitting diode chip and a third wavelength converter,
wherein, in a blue region of a spectrum of the light emitting device, the intensity of light emitted from at least one of the first, second, and third wavelength converters is configured to be greater than that of the corresponding light emitting diode chip,
wherein color coordinates of the first light emitting unit, the second light emitting unit, and the third light emitting unit define a triangular region in a CIE-1931 coordinate system, the triangular region including at least a portion of the Plankian locus,
wherein a maximum color temperature of the Plankian locus included in the triangular region is 5000K or higher, and a minimum color temperature of the Plankian locus included in the triangular region is 3000K or lower,
wherein color temperatures of the Plankian locus between the maximum and minimum color temperatures are all included in the triangular region,
wherein a color coordinate of the first light emitting unit is closer to a color temperature 5000K than those of the second and third light emitting units, and
wherein a color coordinate of the third light emitting unit is closer to a color temperature 3000K than those of the first and second light emitting units.

16. The lighting apparatus of claim 15, wherein the maximum color temperature is 6500K or higher, and the minimum color temperature is 2700K or lower.

17. The lighting apparatus of claim 15, further comprising a base,
wherein the first, second, and third light emitting units are regularly disposed on the base.

18. The lighting apparatus of claim 15, wherein the first to third light emitting units are configured to be operated by dimming.

19. The lighting apparatus of claim 15, further comprising at least one fourth light emitting unit including an ultraviolet or violet light emitting diode chip and a fourth wavelength converter,
wherein a color coordinate of the fourth light emitting unit is located near the color coordinate of the third light emitting unit.

20. The lighting apparatus of claim 19, wherein:
the color coordinate of the third light emitting unit is located above the Plankian locus on the CIE-1931 coordinate system; and the color coordinate of the fourth light emitting unit is located below the Plankian locus on the CIE-1931 coordinate system.

\* \* \* \* \*